United States Patent [19]

Givens

[11] Patent Number: 4,714,881
[45] Date of Patent: Dec. 22, 1987

[54] NUCLEAR MAGNETIC RESONANCE BOREHOLE LOGGING TOOL

[75] Inventor: Wyatt W. Givens, Dallas, Tex.

[73] Assignee: Mobil Oil Corporation, New York, N.Y.

[21] Appl. No.: 885,634

[22] Filed: Jul. 15, 1986

[51] Int. Cl.[4] .......................................... G01R 33/20
[52] U.S. Cl. .................................... 324/303; 324/318
[58] Field of Search ............... 324/300, 301, 303, 318, 324/322

[56] References Cited

U.S. PATENT DOCUMENTS

| | | | |
|---|---|---|---|
| 3,289,072 | 11/1966 | Schuster | 324/303 |
| 3,667,035 | 5/1972 | Slichter | 324/0.5 R |
| 4,350,955 | 9/1982 | Jackson | 324/319 |

FOREIGN PATENT DOCUMENTS 2141236A 12/1984 United Kingdom.

OTHER PUBLICATIONS

"Nuclear Magnetic Logging", R. J. S. Brown and G. W. Gamson, Petroleum Transactions, AIME, vol. 219, 1960, pp. 199-207.
"An Improved Nuclear Magnetism Logging System and its Application to Formation Evaluation", Herrick, Couturie & Best, 1979 Annual Meeting of Society of Petroleum Engineers of AIME (SPE 8361), 1979.
"Western Gas Sands Project Los Alamos NMR Well Logging Tool Development", Brown, Jackson & Koelle, Los Alamos Scientific Laboratory Report LA-10374-PR, (Mar. 1985).

Primary Examiner—Michael J. Tokar
Attorney, Agent, or Firm—Alexander J. McKillop; Michael G. Gilman; George W. Hager, Jr.

[57] ABSTRACT

A nuclear magnetic resonance logging tool comprises spaced-apart arrays of magnets, oppositely polarized, to produce a homogeneous static magnetic field parallel to the borehole when positioned adjacent the borehole wall. Magnetic material is positioned between the arrays of magnets and the borehole fluid when the logging tool is so positioned against the borehole wall to create a weaker magnetic field within the borehole. Transmitter means produces a radio frequency polarization pulse. Receiver means detects nuclear magnetic resonance in the formation following the termination of the polarization pulse.

6 Claims, 5 Drawing Figures

NUCLEAR MAGNETIC RESONANCE BOREHOLE LOGGING TOOL

BACKGROUND OF THE INVENTION

The use of nuclear magnetism in well logging in making direct measurements on the hydrogen content in a subterranean formation and not on the rock matrix has been described by R. J. S. Brown and G. W. Gamson in "Nuclear Magnetism Logging", *Petroleum Transactions*, AIME, Vol. 219, 1960, pp. 199-207. Briefly, many atomic nuclei possess magnetic moments and spins. If a magnetic field is applied, the magnetic nuclei tend to align in the direction of the applied magnetic field. There is a net magnetization, or polarization, which is directly proportional to the strength of the applied magnetic field. When the magnetic field is changed, a new equilibrium value of proton polarization is not immediately established, but requires an amount of time which depends on the nature of the hydrogen content. This process of approaching equilibrium is called "relaxation". Brown and Gamson describe a basic nuclear magnetism logging (NML) tool in which current is passed through a coil to produce a magnetic field in the borehole and in the formation surrounding the borehole at a right angle to the earth's magnetic field. This field, called the "polarizing field", serves to align protons in the formation fluids. When adequate polarization has been established, the current is removed and the polarization precesses in the earth's magnetic field, thereby inducing a damped sinusoidal signal in the same coil originally used to induce the polarization. At the moment precessing begins, such signal is directly proportional to the total number of protons per unit rock volume in the water, oil and gas in the vicinity of the borehole. During the signals-receiving time, the coil is connected to an amplifier and the signal is sent over a logging cable to the surface of the earth. This signal is recorded as an indication of the amount of hydrogen in the formation fluids surrounding the borehole. In addition to this NML tool described by Brown and Gamson, similar NML tools are fully described in U.S. Pat. No. 3,667,035 to Slichter (1972) and in a paper entitled "An Improved Nuclear Magnetism Logging System And Its Application To Formation Evaluation", by Herrick, Couturie and Best, presented at the 1979 Annual Meeting of the Society of Petroleum Engineers of AIME (SPE 8361).

NML tools as described above require a polarization pulse duration of about five times the characteristic time constant for the expotential build-up of the induced polarization and is in the order of about two seconds. However, this polarization pulse duration can be reduced to the order of a few tens of milliseconds or even further to a few tens of microseconds by the technique of radio frequency (RF) pulse nuclear magnetic resonance (NMR). The average power required to generate a polarizing pulse is reduced due to the shorter time period, or for the same average power, the peak power, or energy, in the pulse can be increased. The magnitude of the NMR signal induced in the receiver coil due to the relaxation of the magnetic moment following the termination of the RF pulse is determined by the rate of change of the RF magnetic field produced by the decaying magnetism. This rate of change is determined by the static magnetic field that is present. Such RF pulse NMR logging tools have been described by Brown, Jackson and Koelle in "Western Gas Sands Project Los Alamos NRM Well Logging Tool Development", Los Alamos Scientific Laboratory Report LA-10374-PR (March 1985) and by Claw, Percival and Walters in U.K. Patent Application GB No. 2,141,236-A (Dec. 12, 1984). Both these references describe the generation of a static magnetic field that is significantly greater than the earth's magnetic field. This static magnetic field is generated by the use of a pair of magnets with like poles opposing. The result in a toroidal region of very small volume at some radial distance that is substantially homogenous. The magnitude of the magnetic field in this region is determined by the strength of the pair of magnets. Since the volume of formation material that is polarized within this homogeneous region is small, the resulting NMR signal is weak. The RF transmitter-receiver coil is located between the opposing pole faces of the pair of magnets. This NMR tool has an omnidirectional sensitivity in a plane perpendicular to the axis of the pair of magnets as defined by the toroidal region. Because of this omnidirectional sensitivity, the NMR tool must be centralized in the borehole with the resulting NMR measurement suffering from borehole fluid sensitivity to the RF polarizing pulse. It is, therefore, a specific feature of the present invention to provide an NMR logging tool that overcomes this shortcoming of measuring weak NMR signals from the formation in the presence of interfering, and sometimes dominant, borehole fluid RF signals.

SUMMARY OF THE INVENTION

The present invention is directed to a borehole logging method and tool for measuring the nuclear magnetic resonance of earth formations surrounding a borehole as an indication of the hydrogen content of such formations. More particularly, this invention provides for a static magnetic field in such earth formations that is highly directional, is much greater than the earth's magnetic field, and is relatively homogeneous over a large volume sample of the formations. This static magnetic field produces an enhanced proton NMR signal from the formations with virtually no sensitivity of the logging tool to borehole fluid RF signals.

A downhole logging sonde houses a first array of magnets polarized in a direction perpendicular to the longitudinal axis of the logging sonde and a second array of magnets at an axially spaced-apart position from such first array and polarized in a direction perpendicular to the longitudinal axis of the logging sonde such that it is 180° out-of-phase with the polarization of the first array. Magnetic material is positioned within the sonde in juxtaposition with a first set of common poles of the magnets of the first array and in juxtaposition with a second set of common poles of the magnets of the second array which are of opposite polarity to that of the first set of common poles. The logging sonde is positioned against a wall of a borehole traversing a subterranean formation such that the first and second arrays are in juxtaposition with the borehole wall and the magnetic material is between the first and second sets of common poles of such first and second arrays, respectively, and the borehole fluid. With such arrangement, the path of the magnetic lines of induction between the first and second arrays travels outward into the formation to create a relatively homogeneous static magnetic field parallel to the axis of the borehole and travels inward through the magnetic material to create a weaker static magnetic field within the borehole. To further weaken the static magnetic field within the borehole, the magnetic material may be extended between the first and second sets of common poles of such first and second arrays to form a magnetic yoke that enhances the travel of the magnetic lines of induction between such first and second sets of common poles.

The magnets comprising the first and second arrays have progressively differing magnetic strengths within each array. The magnets of the first array are positioned adjacent one another along the longitudinal direction of the logging sonde and progressively increase in strength along such longitudinal direction away from the second array. The magnets of the second array are positioned adjacent one another along the longitudinal direction of the logging sonde and progressively increase in strength along such longitudinal direction away from the first array. Such magnets may be permanent magnets, or more preferably, electromagnets.

In one embodiment, a first radio frequency transmitter coil is positioned adjacent the first array and is oriented perpendicular to the longitudinal axis of the logging sonde. A second radio frequency transmitter coil is positioned adjacent the second array, is oriented perpendicular to the longitudinal axis of the logging sonde, and is electrically connected to the first radio frequency transmitter coil to produce a radio frequency polarization pulse in which the contributions from the two transmitter coils are in-phase. This increases the volume of the formation, and hence the number of hydrogen protons, that are polarized by the radio frequency polarization pulse. A radio frequency receiver coil is positioned between the first and second arrays and is oriented perpendicular to the first and second transmitter coils for making the pulse nuclear magnetic resonance measurments following the termination of the first and second ratio frequency polarization pulses. The receiver coil may be magnetically shielded in the direction of the borehole to minimize the reception of any nuclear magnetic resonance from the borehole fluid.

In another embodiment, a radio frequency transmitter coil is positioned between the first and second arrays and is oriented perpendicular to the longitudinal axis of the logging sonde to produce a radio frequency polarization pulse. A first radio frequency receiver coil is positioned adjacent the first array and is oriented perpendicular to the transmitter coil. A second radio frequency receiver coil is positioned adjacent the second array, is oriented perpendicular to the transmitter coil, and is electrically connected in-phase with the first receiver coil so as to produce a larger NMR signal. Both receiver coils may be magnetically shielded in the direction of the borehole to minimize the reception of any nuclear magnetic resonance from the borehole fluid.

DESCRIPTION OF THE PREFERRED EMBODIMENT

Figure 1:
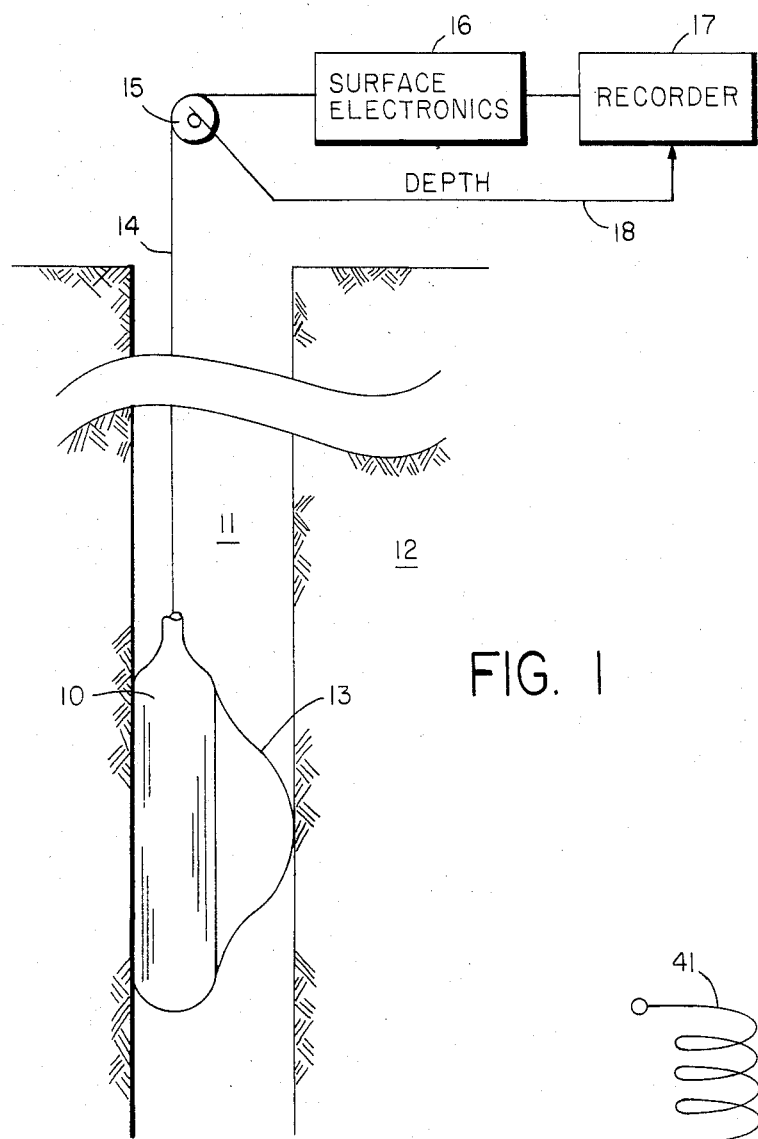
FIG. 1 is a schematic drawing illustrating a logging system for carrying out the NMR measurements of the formations surrounding a borehole.

The NMR well logging tool of the present invention comprises an elongated downhole logging sonde, or housing, 10 within a borehole 11 traversing a subterranean formation 12 of interest. Signals between the sonde 10 and surface electronics 16 are transmitted by way of suitable conductors in a logging cable 14 passing over sheave 15. A depth signal derived from sheave 15 as the logging tool is moved through the borehole is applied over conductor 18 to recorder 17, whereby the downhole NMR measurements are correlated with the depths at which they are taken. A bow spring 13 is used to hold the logging sonde 10 against the borehole wall during the taking of the NMR measurements.

Figure 2:
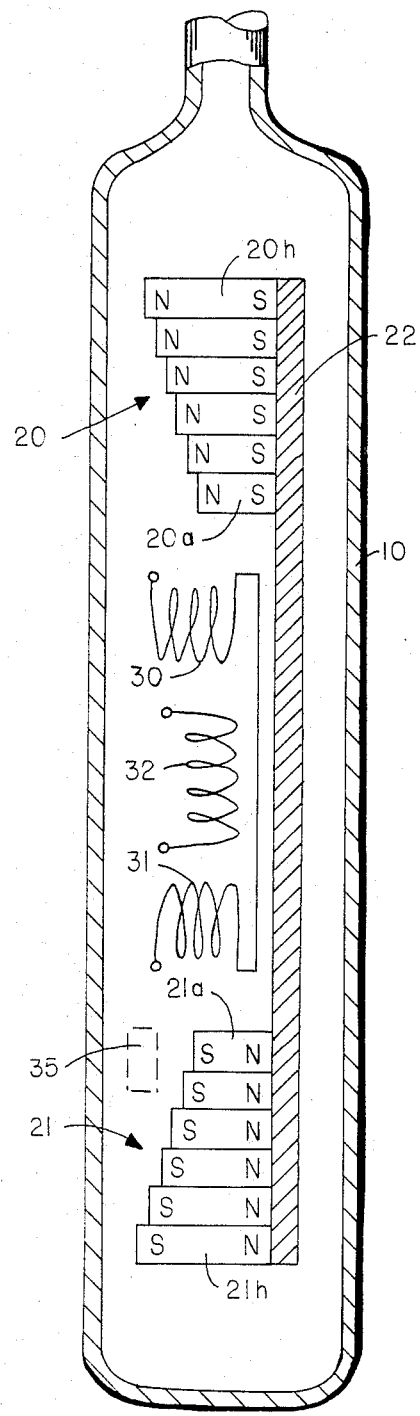
FIG. 2 illustrates details of the borehole logging tool employed in the logging system of FIG. 1.

Referring now to FIG. 2, the logging sonde 10 will be described in more detail as it is used to carry out NMR measurement on the formation 12 surrounding the borehole 11. A highly directional static magnetic field is created by an arrangment of permanent magnets having their pole orientations perpendicular to the longitudinal axis of the logging sonde 10. The upper array 20 has its pole orientation 180° out-of-phase with that of the lower array 21. As the magnets in upper array 20 progress along the longitudinal axis of the logging sonde 10 away from the lower array 21, they increase in strength; that is, magnetic strength progressively increases from magnet 20a to magnet 20h. In like manner, the magnets in lower array 21 increase in strength as they progress along the longitudinal axis of the logging sonde 10 away from upper array 20; that is, magnetic strength progressively increases from magnet 21a to 21h.

Figure 3:
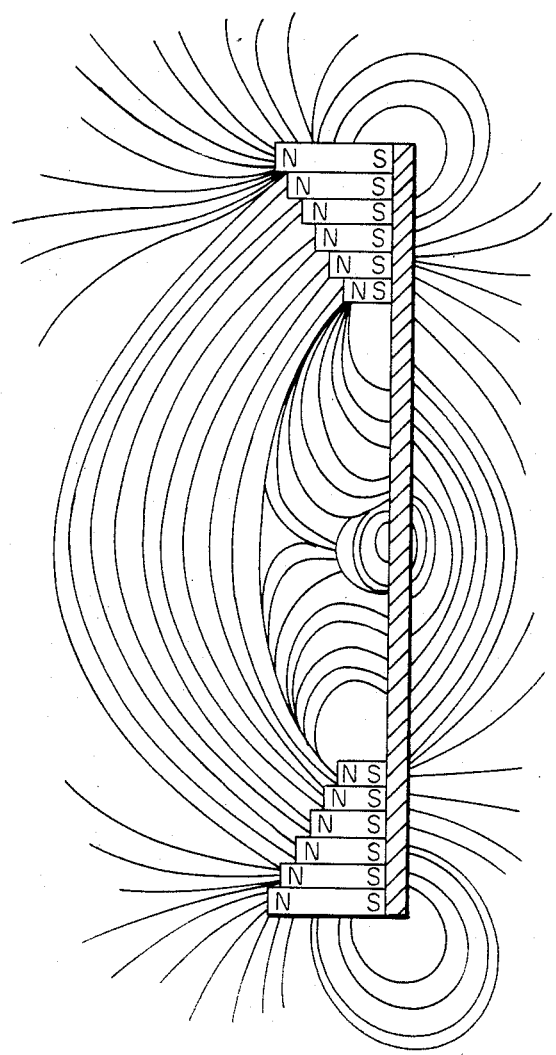
FIG. 3 illustrates the magnetic field generated by the borehole logging tool of FIG. 2.

This arrangement of magnet arrays 20 and 21 with their pole orientations perpendicular to the longitudinal axis of the logging sonde 10 and opposite in direction to each other creates a relatively homogeneous magnetic field in a large portion of its path through the formation in a direction parallel to the borehole axis as shown in FIG. 3 that is much greater than the earth's magnetic field.

Further illustrated in FIG. 2 are a pair of transmitter coils 30 and 31 and a receiver coil 32. The transmitter coils 30 and 31 are oriented perpendicular to the longitudinal axis of the logging tool and are connected so as to be in-phase; that is, in such a way that the radio frequency (RF) magnetic lines of induction resulting from their RF polarization pulses enhance one another. This increases the volume of the formation, and hence the number of hydrogen protons that are polarized by the RF pulses. Receiver coil 32 is oriented perpendicular to the transmitter coils and is, therefore, virtually insensitive to the high powered transmitted RF polarization pulse. With this configuration, detection of the NMR signal following termination of the RF polarization pulses can begin earlier than is possible if the transmitter coils served the dual function of transmitting and receiving. Further, the receiver coil can optimize signal-to-noise rejection since it serves only one function.

The upper and lower magnet arrays 20 and 21 have their N and S poles, respectively, mounted against a high permeability magnetic material, such as the iron yoke 22. The gradient in magnet strength array from yoke 22 not only forces the paths for the magnetic lines of induction further into the formation, but also creates a large region of homogeous magnetic field in the formation along a portion of such paths. With the logging sonde 10 forced against the borehole wall by the bow spring 13, the magnetic lines of induction in the direction of the borehole concentrate in the iron yoke 22, hence the magnetic field in the formation is much greater than in the borehole fluid. The yoke 22 further serves to shield the borehole fluid from the transmitted RF pulse and to also shield the receiver coil from NMR signal reception from protons in the borehole fluid. These functions of the yoke 22 combine to make the logging sonde 10 insensitive to NMR response from the borehole fluid.

Figure 4:
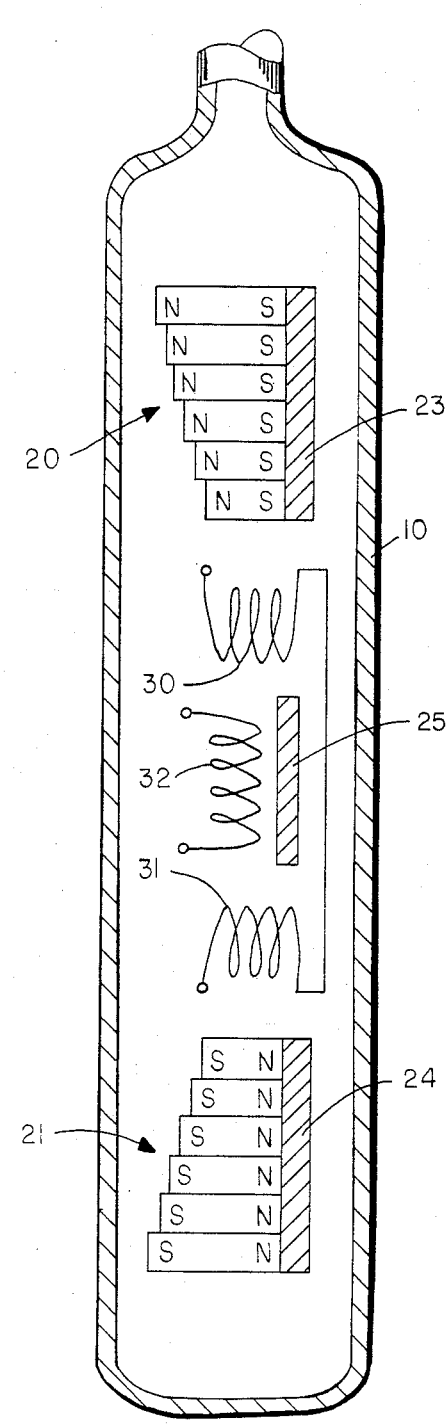

In an alternate arrangement of FIG. 4, the magnet arrays 20 and 21 are shown as having separate iron yokes 23 and 24, respectively. This dual yoke arrangement could have advantage since the single yoke 22 of FIG. 2 could lead to excessive loss of RF transmitter energy in the yoke due to eddy currents. However, there will be a stronger magnetic field in the direction of the borehole fluid. To ensure that no NMR signal is received from protons in the borehole fluid, the receiver coil 32 is shielded in the borehole fluid direction with a metal shield 25.

Figure 5:
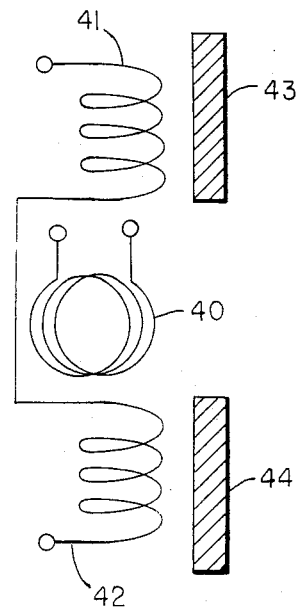
FIGS. 4-5 illustrate alternate embodiments to the borehole logging tool of FIG. 2.

In a still further arrangment of FIG. 5, a single transmitter coil 40 is employed along with a pair of receiver coils 41 and 42. The transmitter coil 40 is oriented perpendicular to the magnetic field in the formation and perpendicular to the axis of the logging sonde 10. This orientation of transmitter coil 40 is perpendicular to that of the transmitter coils 30 anad 31 of FIGS. 2 and 4. The pair of receiver coils 41 and 42 are connected so that the received NMR signals are in-phase. To minimize sensitivity to the borehole fluid, metal shields 43 and 44 are provided to prevent reception of NMR signals from the borehole fluid.

Having described the logging sonde 10 in conjunction with the arrangements of FIGS. 2, 4 and 5, it can be appreciated that electromagnets may be utilized in place of the permanent magnets in the arrays 20 and 21. The strength and polarity of the electromagnets can be maintained the same as for the permanent magnets by control of the direction and number of turns of the coil surrounding each magnet. The magnetic field from the electromagnets can be maintained constant by use of a magnetic field sensor 35 (e.g., a Hall-effect device in a feedback circuit), shown in dashed lines in FIG. 2. A particular advantage of the use of electromagnets is that the magnetic field can be turned off. This is important in open-hole logging where the logging sonde 10 must pass through surface steel casing. There is also much steel associated with drilling rigs and logging trucks which would make handling and use of a tool employing permanent magnets difficult due to magnetic attraction.

As can be seen from the foregoing, the well logging method and tool of the present invention provides for a highly directional static magnetic field that is greater than the earth's magnetic field and is relatively homogeneous over a large volume of the formation while making the logging sonde insensitive to the borehole fluid without the addition of magnetic material to the borehole fluid in order to suppress the borehole response. Having now described the present invention in conjunction with the embodiments of FIGS. 2, 4 and 5, it is to be understood that various changes and modifications may become apparent to one skilled in the art without departing from the spirit and scope of the invention as set forth in the appended claims. Other magnet arrangements may fall within the present invention if they produce a highly directed static magnetic field in the formation direction that is greater than the static magnetic field directed toward the borehole fluid. Other coil arrangements may also fall within the present invention if they preserve sensitivity to NMR measurements from the formation to the exclusion of the borehole fluid by way of various shielding to the transmitter or receiver coils.

I claim:

1. A nuclear magnetic resonance borehole logging tool comprising:
    (a) an elongated logging sonde,
    (b) a first array of magnets positioned within said sonde and polarized in a direction perpendicular to the longitudinal axis of said sonde,
    (c) a second array of magnets positioned within said sonde at an axially spaced-apart position from said first array and polarized in a direction perpendicular to the longitudinal axis of said logging sonde such that it is 180° out-of-phase with the polarization of said first array,
    (d) magnetic material positioned within said logging sonde in juxtaposition with a first set of common poles of the magnets of said first array,
    (e) magnetic material positioned within said logging sonde in juxtaposition with a second set of common poles of the magnets of said second array which are of opposite polarity to that of said first set of common poles, and
    (f) means for positioning and orienting said logging sonde against the wall of a borehole such that said first and second arrays are in juxtaposition with the borehole wall and said magnetic material is between both said first set of common poles of said first array and said second set of common poles of said second array and the borehole fluid, whereby the magnetic lines of induction between said first and second arrays travel outward into the formation surrounding the borehole to create a homogeneous static magnetic field parallel to the axis of the borehole and travel inward through said magnetic material to create a weaker static magnetic field in the direction of said borehole fluid.

2. The borehole logging tool of claim 1 further comprising:
    (a) a first radio frequency transmitter coil positioned adjacent said first array and oriented perpendicular to the longitudinal axis of said logging sonde for transmitting a first radio frequency polarization pulse into said formation to polarize the hydrogen protons in said formation,
    (b) a second radio frequency transmitter coil positioned adjacent said second array, oriented perpendicular to the longitudinal axis of said logging sonde, and electrically connected to said first radio frequency transmitter coil to produce a second radio frequency polarization pulse in which the contributions from said first and second radio frequency transmitter coils are in-phase, and
    (c) a radio frequency receiver coil positioned between said first and second arrays and oriented perpendicular to said first and second transmitter coils for making pulse nuclear magnetic resonance measurements following the termination of said first and second radio frequency polarization pulses.

3. The borehole logging tool of claim 2 wherein said receiver coil is magnetically shielded in the direction of the borehole to minimize the reception of any nuclear magnetic resonance from protons in the borehole fluid.

4. The borehole logging tool of claim 1, further comprising:
   (a) a radio frequency transmitter coil positioned between said first and second arrays and oriented perpendicular to the longitudinal axis of said logging sonde for transmitting a radio frequency polarization pulse into said formation to polarize the hydrogen protons in said formation,
   (b) a first radio frequency receiver coil positioned adjacent said first array and oriented perpendicular to said transmitter coil to produce a first pulse nuclear magnetic resonance measurement following the termination of said radio frequency polarization pulse, and
   (c) a second radio frequency receiver coil positioned adjacent said second array, oriented perpendicular to said transmitter coil, and electrically connected to said first radio frequency receiver coil to produce a nuclear magnetic resonance measurement following the termination of said radio frequency polarization pulse in which the contributions from said first and second radio frequency receiver coils are in-phase.

5. The borehole logging tool of claim 4 wherein both said first and second receiver coils are magnetically shielded in the direction of said borehole fluid to minimize the reception of any nuclear magnetic resonance from protons in the borehole fluid.

6. A method for measuring the nuclear magnetic resonance of earth formations surrounding a borehole as an indication of the hydrogen content of such formations, comprising the steps of:
   (a) creating a directional homogeneous static magnetic field in the earth formations surrounding said borehole that is greater than the earth's magnetic field and is parallel to the axis of the borehole,
   (b) transmitting a radio frequency polarization pulse into said earth formations to polarize the hydrogen protons in said formations, and
   (c) detecting the nuclear magnetic resonance signal from said earth formations following the termination of said radio frequency polarization pulse as a measure of the number of hydrogen protons polarized within said earth formations.

* * * * *